United States Patent
Luo et al.

(10) Patent No.: US 11,714,358 B2
(45) Date of Patent: Aug. 1, 2023

(54) INTELLIGENT CORRECTION DEVICE CONTROL SYSTEM FOR SUPER-RESOLUTION LITHOGRAPHY PRECISION MASK

(71) Applicant: The Institute of Optics and Electronics, The Chinese Academy of Sciences, Sichuan (CN)

(72) Inventors: Xiangang Luo, Sichuan (CN); Ping Gao, Sichuan (CN); Mingbo Pu, Sichuan (CN); Xiaoliang Ma, Sichuan (CN); Xiong Li, Sichuan (CN)

(73) Assignee: The Institute of Optics and Electronics, The Chinese Academy of Sciences, Chengdu (CN)

( * ) Notice: Subject to any disclaimer, the term of this patent is extended or adjusted under 35 U.S.C. 154(b) by 0 days.

(21) Appl. No.: 17/997,189

(22) PCT Filed: Apr. 28, 2021

(86) PCT No.: PCT/CN2021/090688
§ 371 (c)(1),
(2) Date: Oct. 26, 2022

(87) PCT Pub. No.: WO2021/219030
PCT Pub. Date: Nov. 4, 2021

(65) Prior Publication Data
US 2023/0126995 A1 Apr. 27, 2023

(30) Foreign Application Priority Data
Apr. 29, 2020 (CN) .......................... 202010355155.2

(51) Int. Cl.
*G03F 9/00* (2006.01)
*H04N 25/71* (2023.01)
(Continued)

(52) U.S. Cl.
CPC ......... *G03F 9/7026* (2013.01); *G05B 19/056* (2013.01); *G06T 7/0004* (2013.01);
(Continued)

(58) Field of Classification Search
CPC ... G03F 9/7026; G05B 19/056; G06T 7/0004; H04N 25/71; H04N 23/695
See application file for complete search history.

(56) References Cited

U.S. PATENT DOCUMENTS

| 4,737,824 A * | 4/1988 | Sakai ...................... G03F 7/707 |
| | | 355/73 |
| 6,549,271 B2 * | 4/2003 | Yasuda ............... G03F 7/70358 |
| | | 355/53 |

(Continued)

FOREIGN PATENT DOCUMENTS

| CN | 101446777 A | 6/2009 |
| CN | 104570592 A | 4/2015 |

(Continued)

OTHER PUBLICATIONS

"Chinese Application Serial No. 202010355155.2, Office Action dated Feb. 2, 2021", w/English Translation, (Feb. 2, 2021), 7 pgs.

(Continued)

*Primary Examiner* — Hung V Nguyen
(74) *Attorney, Agent, or Firm* — Schwegman Lundberg & Woessner, P.A.

(57) ABSTRACT

Provided is an intelligent correction device control system for a super-resolution lithography precision mask, including: a sixteen-way pneumatic fine-tuning mask deformation control subsystem configured to deform a mask, detect a force value of a mask deformation, compare the force value of the mask deformation with an output force set value, and generate a first control feedback quantity to adjust a force deforming the mask, so as to control a deformation quantity of the mask; and an alignment subsystem configured to acquire images of the mask and a substrate, and adjust a position between the mask and the substrate according to the images, so as to align the mask with the substrate.

21 Claims, 4 Drawing Sheets

(51) Int. Cl.
   *G05B 19/05* (2006.01)
   *G06T 7/00* (2017.01)
   *H04N 23/695* (2023.01)

(52) U.S. Cl.
   CPC ... *H04N 25/71* (2023.01); *G05B 2219/13004* (2013.01); *H04N 23/695* (2023.01)

(56) References Cited

U.S. PATENT DOCUMENTS

| | | | |
|---|---|---|---|
| 7,019,816 B2 * | 3/2006 | Ottens | G03F 7/707 355/75 |
| 2017/0082918 A1 | 3/2017 | Kugimiya | |

FOREIGN PATENT DOCUMENTS

| | | |
|---|---|---|
| CN | 106933024 A | 7/2017 |
| CN | 107817653 | 3/2018 |
| CN | 111580359 A | 8/2020 |
| JP | 2007103657 | 4/2007 |
| JP | 2007206575 | 8/2007 |

OTHER PUBLICATIONS

"International Application Serial No. PCT/CN2021/090688, International Search Report dated Jul. 14, 2021", w/ English Translation, (Jul. 14, 2021), 5 pgs.

"International Application Serial No. PCT/CN2021/090688, Written Opinion dated Jul. 14, 2021", w/ English Translation, (Jul. 14, 2021), 10 pgs.

"Japanese Application Serial No. 2022-565880, Office Action dated Apr. 25, 2023", w English Translation, (Apr. 25, 2023), 9 pgs.

* cited by examiner

INTELLIGENT CORRECTION DEVICE CONTROL SYSTEM FOR SUPER-RESOLUTION LITHOGRAPHY PRECISION MASK

CROSS REFERENCE TO RELATED APPLICATION

This application is a U.S. National Stage Filing under 35 U.S.C. § 371 from International Application No. PCT/CN2021/090688, filed on Apr. 28, 2021, and published as WO2021/219030 on Nov. 4, 2021, which claims priority to Chinese patent Application No. CN202010355155.2, filed on Apr. 29, 2020; the benefit of priority of each of which is hereby claimed herein, and which applications and publication are hereby incorporated herein by reference in their entireties.

TECHNICAL FIELD

The present disclosure relates to a field of lithography technology, and in particular, to an intelligent correction device control system for a super-resolution lithography precision mask.

BACKGROUND

With the rapid development of the semiconductor integrated circuit technology, for a lithography machine, which is core equipment of the semiconductor technology, requirements for the design and development of a lithography machine control system are becoming higher and higher.

In a current control system, a USB serial port transmission or an Ethernet port transmission is mostly used as an image processing and acquisition manner. The transmission speeds of these transmission manners are relatively slow, an efficiency of a subsequent processing through a control system will be reduced, and all image processing operations are completed by a host computer control system. This greatly increases the workload of a host computer, which will slow down the processing speed of an entire system and reduce the alignment efficiency. Regard this problem, a control system having a higher control precision is also required at present, and an alignment and a mask correction may be completed accurately, quickly and stably through this system.

SUMMARY

In order to solve the above problem, according to one aspect of the present disclosure, there is provided an intelligent correction device control system for a super-resolution lithography precision mask, including: a sixteen-way pneumatic fine-tuning mask deformation control subsystem configured to deform a mask, detect a force value of a mask deformation, compare the force value of the mask deformation with an output force set value, and generate a first control feedback quantity to adjust a force deforming the mask, so as to control a deformation quantity of the mask; and an alignment subsystem configured to acquire images of the mask and a substrate, and adjust a position between the mask and the substrate according to the images, so as to align the mask with the substrate.

According to the embodiments of the present disclosure, the sixteen-way pneumatic fine-tuning mask deformation control subsystem includes a PLC controller subsystem, the PLC controller subsystem including: a PID controller, an analog input extension module, an analog output extension module, a digital input extension module and a digital output extension module; wherein, the analog input extension module is configured to perform an A/D conversion to an acquired analog electrical signal of the force value; the digital input extension module is configured to input a digital signal obtained by the A/D conversion to the PID controller; the PID controller is configured to compare the digital signal obtained by the A/D conversion with the output force set value, and generate the first control feedback quantity; the digital output extension module is configured to output a digital signal of the first control feedback quantity to the analog output extension module; and the analog output extension module is configured to perform a D/A conversion to the digital signal of the first control feedback quantity, and output an analog electrical signal of the first control feedback quantity obtained by the conversion, so as to form a closed-loop feedback to the mask deformation.

According to the embodiments of the present disclosure, the sixteen-way pneumatic fine-tuning mask deformation control subsystem further includes an air pressure output control subsystem, the air pressure output control subsystem including: a sixteen-way cylinder and a sixteen-way electro-pneumatic proportional valve; the sixteen-way cylinder is configured to output the force deforming the mask, and the sixteen-way electro-pneumatic proportional valve is configured to control an intensity of an output force of the sixteen-way cylinder according to the first control feedback quantity.

According to the embodiments of the present disclosure, the sixteen-way pneumatic fine-tuning mask deformation control subsystem further includes a mask force detection feedback subsystem, the mask force detection feedback subsystem including: a sixteen-way force sensor configured to acquire the force value of the mask deformation; and a pressure sensor configured to acquire an air pressure in a connection air pipe of the sixteen-way air cylinder.

According to the embodiments of the present disclosure, the PLC controller subsystem is further configured to compare the air pressure with a preset air pressure value, and generate a second control feedback quantity; the sixteen-way pneumatic fine-tuning mask deformation control subsystem further includes a commutating solenoid valve configured to control a direction of the output force of the sixteen-way cylinder according to the second control feedback quantity; and the PLC controller subsystem is connected with the solenoid valve through an intermediate relay.

According to the embodiments of the present disclosure, the alignment subsystem includes: an eight-way image acquisition CCD camera, wherein each way of the CCD camera is provided with a telecentric lens for acquiring the images; two image acquisition cards, wherein each of the image acquisition cards is configured to receive and transmit images acquired by four-ways of the CCD camera; an image processor configured to preprocess the images, transmit the preprocessed images to a central control system, allow the central control system to judge whether the mask is aligned with the substrate according to the images, and generate a regulation instruction for aligning the mask with the substrate; an image acquisition adjustment motor control subsystem configured to adjust a position of the substrate according to the regulation instruction, so as to align the substrate with the mask; and an eight-way illuminating subsystem configured to provide an illumination for the telecentric lens connected with each way of the CCD camera.

According to the embodiments of the present disclosure, the system further includes: a host computer, wherein a central control system is built in the host computer; wherein the host computer is configured to issue a program instruction to the PLC controller subsystem according to an actual mask deformation control requirement, and the program instruction is configured to generate the first control feedback quantity and regulate the sixteen-way pneumatic fine-tuning mask deformation control subsystem to adjust the deformation quantity of the mask; and the host computer is further configured to judge whether the mask is aligned with the substrate according to the images, and generate a regulation instruction for aligning the mask with the substrate.

According to the embodiments of the present disclosure, the host computer is in connection and communication with the sixteen-way pneumatic fine-tuning mask deformation control subsystem through an industrial Ethernet bus, the host computer is in connection and communication with the alignment subsystem through an industrial Ethernet bus, a PCIe bus or an RS232 serial port communication bus, and the image acquisition card is in connection and communication with the host computer through a PCIe X4 interface.

According to the embodiments of the present disclosure, the alignment subsystem further includes: a compact linear displacement stage configured to adjust a position of the CCD camera; and a multi-channel motion controller configured to move the compact linear displacement stage for a position adjustment according to the regulation instruction issued by the central control system.

According to another aspect of the present disclosure, there is provided an intelligent correction device control system for a super-resolution lithography precision mask, including a sixteen-way pneumatic fine-tuning mask deformation control subsystem and an alignment subsystem, wherein the sixteen-way pneumatic fine-tuning mask deformation control subsystem comprises a mask force detection feedback subsystem, an air pressure output control subsystem, and a PID controller subsystem achieved by a PLC, wherein the alignment subsystem comprises an eight-way image acquisition CCD, an image acquisition card, an image processor and an eight-way illuminating subsystem, and wherein image data acquired by the image acquisition CCD is transmitted to a high-performance host computer through the image acquisition card, the host computer preprocesses a related image through the image processor and then makes a feedback to a central control system, so as to provide an image support for an alignment program, and the eight-way illuminating subsystem is connected with a phase modulator through a signal generator to generate an excitation signal, so that a light emitted by a helium-neon laser is modulated to provide an illumination for a telecentric lens connected with the CCD through a related optical path and an optical fiber transmission channel.

According to the embodiments of the present disclosure, a standard control bus is used as a control bus of the system; and an industrial Ethernet bus based on a TCP/IP protocol or a customizable industrial Ethernet bus is used by the sixteen-way pneumatic fine-tuning mask deformation control subsystem.

According to the embodiments of the present disclosure, the sixteen-way pneumatic fine-tuning mask deformation control subsystem further comprises a PLC controller subsystem and analog input and output extension modules, a PID controller inside the PLC, a mask force detection feedback subsystem and an air pressure output control subsystem.

According to the embodiments of the present disclosure, an industrial Ethernet bus based on a TCP/IP protocol or a customizable industrial Ethernet bus is used by the alignment subsystem, or a PCIe bus based on a PCIe X4 or a customizable PCIe bus is used by the alignment subsystem, or an RS232 serial port communication bus based on a USRT or a customizable RS232 serial port communication bus is used by the alignment subsystem.

According to the embodiments of the present disclosure, the alignment subsystem includes a multi-channel image acquisition subsystem, an image transmission subsystem, and an image processing subsystem, an image acquisition adjustment motor control subsystem and an eight-way illuminating subsystem.

According to the embodiments of the present disclosure, the system comprises: a high-performance industrial computer for an operation of the system and a high-speed image processing calculation.

According to the embodiments of the present disclosure, the PLC controller subsystem includes: a PLC controller for providing a sixteen-way PID controller to complete an output force closed-loop control algorithm; an analog input extension module for a force sensor analog input conversion to complete a feedback force D/A conversion, and also for an input air pressure detection to complete a D/A conversion; an analog output extension module for an electro-pneumatic proportional valve control signal output to complete an A/D conversion; a digital output extension module for a cylinder output commutation control to complete a cylinder push-out and retraction control, wherein this process is completed by controlling an intermediate relay to start a corresponding commutating solenoid valve; and a digital input extension module for a sensor signal reception.

According to the embodiments of the present disclosure, the multi-channel image acquisition subsystem includes: an eight-way image acquisition CCD for image acquisition; and a telecentric lens for use in cooperation with the CCD.

According to the embodiments of the present disclosure, the image transmission subsystem includes: an image acquisition card, wherein a single image acquisition card is configured for a four-channel CCD acquisition data transmission, and the image acquisition card comprises a trigger for an external triggering condition reception; an acquisition card internal system program for an operation application of the image acquisition card; a PHY transceiver for transmitting data to a PCIe interface, wherein the data is received from an Ethernet interface and then processed through a system program; and four DDR RAMS for providing an internal program running memory.

According to the embodiments of the present disclosure, the image processing subsystem comprises an image processor, wherein an RTX 2080 SUPER graphics processing card of NVIDIA company is used as the image processor, and the image processor is configured to comprehensively process data acquired and simply preprocessed by the image acquisition card, and transmit processed image data to the central control system.

According to the embodiments of the present disclosure, the image acquisition adjustment motor control subsystem includes: a compact linear displacement stage for a CCD position adjustment; and a multi-channel motion controller for a motion control in cooperation with the compact linear displacement stage.

According to the embodiments of the present disclosure, the eight-way illuminating subsystem includes: a helium-neon laser configured to generate a light having a wavelength of 633 nm; a focusing lens configured to focus a collimated light into an optical cable; a collimating lens configured to collimate an output light of the optical cable; an optical cable configured to transmit an optical signal; an adapter configured to connect an optical fiber end with a telecentric objective lens; a phase modulator configured to modulate a related output optical signal; and a signal generator configured to generate an excitation signal of the phase modulator.

DESCRIPTION OF REFERENCE SIGNS

100-central control system; 101-control bus; 102-host computer; 103-image processor; 104-image acquisition card; 105-image acquisition adjustment motor control subsystem (motor controller); 106-phase modulator; 107-PLC controller subsystem; 110/112-PCIe transmission channel; 120/122-Ethernet transmission channel; 130/132-serial port communication bus channel; 140/143-optical fiber transmission channel; 150/154-digital and analog transmission channel; 200-alignment subsystem; 300-eight-way illuminating subsystem; 400-sixteen-way pneumatic fine-tuning mask deformation control subsystem

DETAILED DESCRIPTION OF EMBODIMENTS

Hereinafter, the embodiments of the present disclosure will be described with reference to the accompanying drawings. However, it should be understood that these descriptions are only exemplary, and are not intended to limit the scope of the present disclosure. In the following detailed description, for convenience of explanation, numerous specific details are set forth in order to provide a thorough understanding to the embodiments of the present disclosure. However, it is apparent that one or more embodiments may also be implemented without these specific details. Additionally, in the following description, descriptions of commonly known structures and technologies are omitted to avoid unnecessarily obscuring the concepts of the present disclosure.

The terms used herein are only for the purpose of describing specific embodiments, and are not intended to limit the present disclosure. The terms "comprise", "include" and the like used herein indicate a presence of a feature, a step, an operation and/or a component, but do not exclude a presence or an addition of one or more other features, steps, operations or components.

According to one aspect of the present disclosure, there is provided an intelligent correction device control system for a super-resolution lithography precision mask, including: a sixteen-way pneumatic fine-tuning mask deformation control subsystem 400 and an alignment subsystem 200.

The sixteen-way pneumatic fine-tuning mask deformation control subsystem 400 is configured to deform a mask, detect a force value of a mask deformation, and compare the force value of the mask deformation with an output force set value, and generate a first control feedback quantity, so as to adjust a force deforming the mask, thereby controlling a deformation quantity of the mask.

The alignment subsystem 200 is configured to acquire images of the mask and a substrate, adjust a position between the mask and the substrate according to the images, and align the mask with the substrate.

Specifically, the sixteen-way pneumatic fine-tuning mask deformation control subsystem 400 includes a PLC controller subsystem 107. The PLC controller subsystem 107 includes: a PID controller, an analog input extension module, an analog output extension module, a digital input extension module and a digital output extension module.

Figure 1:
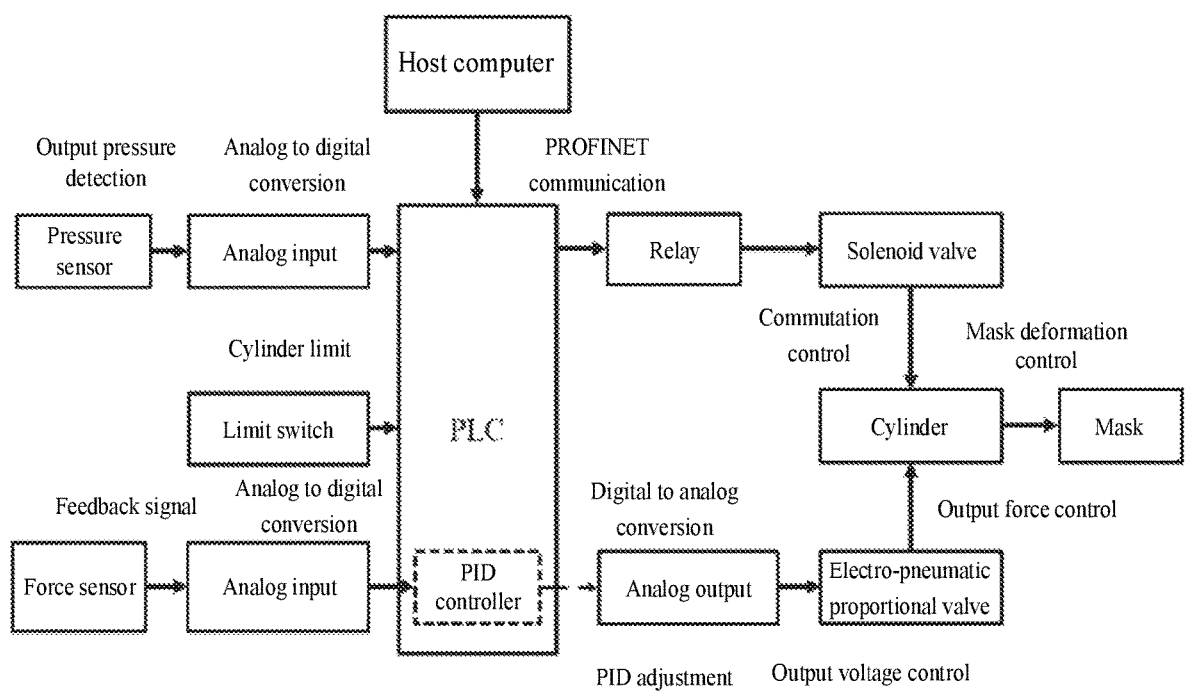
FIG. 1 schematically shows a schematic diagram of a single-way pneumatic fine-tuning mask deformation control structure of a sixteen-way pneumatic fine-tuning mask deformation control subsystem according to the embodiments of the present disclosure.

FIG. 1 schematically shows a schematic diagram of a single-way pneumatic fine-tuning mask deformation control structure of a sixteen-way pneumatic fine-tuning mask deformation control subsystem according to the embodiments of the present disclosure.

As shown in FIG. 1, the analog input extension module is configured to perform an A/D conversion to an acquired analog electrical signal of the force value; the digital input extension module is configured to input a digital signal obtained by the A/D conversion to the PID controller; the PID controller is configured to compare the digital signal obtained by the A/D conversion with the output force set value, and generate the first control feedback quantity; the digital output extension module is configured to output a digital signal of the first control feedback quantity to the analog output extension module; and the analog output extension module is configured to perform a D/A conversion to the digital signal of the first control feedback quantity, and output an analog electrical signal of the first control feedback quantity obtained by the conversion to form a closed-loop feedback to the mask deformation.

In the embodiments of the present disclosure, the sixteen-way pneumatic fine-tuning mask deformation control subsystem 400 further includes a mask force detection feedback subsystem. Specifically, the mask force detection feedback subsystem includes a sixteen-way force sensor configured to acquire the force value of the mask deformation and transmit an analog electrical signal of an acquired force value to a PID controller through an analog input extension module. The mask force detection feedback subsystem further includes a pressure sensor configured to acquire an air pressure in a connection air pipe of the sixteen-way air cylinder.

Figure 2:
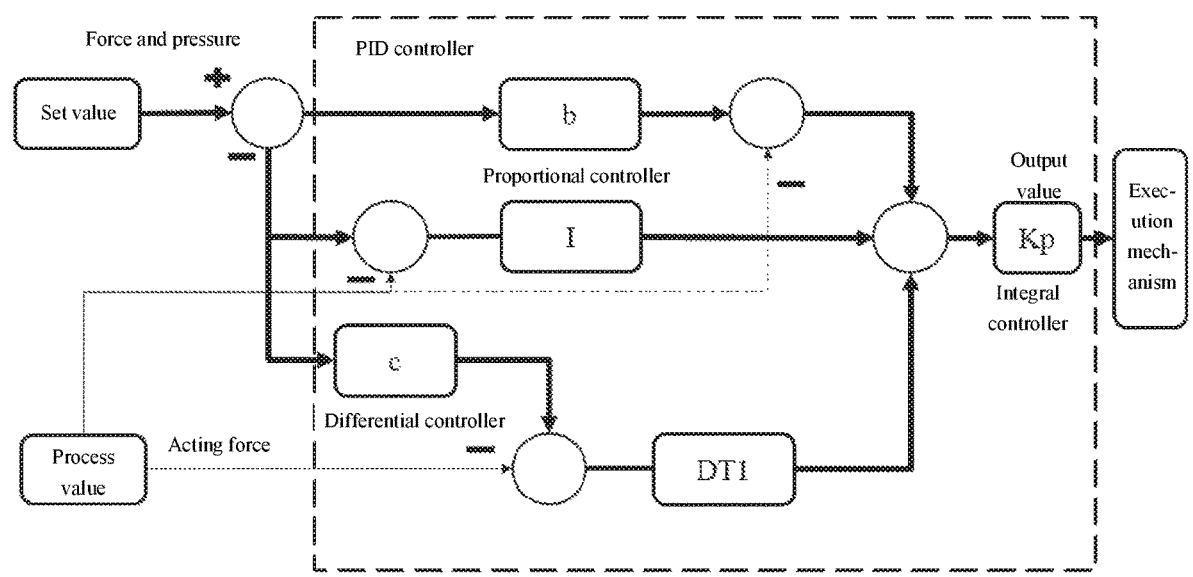
FIG. 2 schematically shows a schematic structural diagram of a single-way PID control loop of a sixteen-way pneumatic fine-tuning mask deformation control subsystem according to the embodiments of the present disclosure.

FIG. 2 schematically shows a schematic structural diagram of a single-way PID control loop of a sixteen-way pneumatic fine-tuning mask deformation control subsystem 400 according to the embodiments of the present disclosure.

As shown in FIG. 2, the PLC controller subsystem 107 provides a sixteen-way PID controller for completing a mask deformation control. The PID controller has a function equation as follows:

$$y = K_p \left[ (b \cdot w - x) + \frac{1}{T_j \cdot S}(w - x) + \frac{T_D \cdot S}{a \cdot T_D \cdot S + 1}(C \cdot W - X) \right]$$

In the equation, y is an output value of a PID algorithm and an output value in the system after calculation, Kp is a proportional gain, S is a Laplace operator, b is a proportional action weight, w is a set value, x is a process value, i.e., an acting force detected by the force sensor, c is a differential action weight, TI is an integral action time, and TD is a differential action time.

In the embodiments of the present disclosure, the sixteen-way pneumatic fine-tuning mask deformation control subsystem 400 further includes an air pressure output control subsystem. The air pressure output control subsystem includes: a sixteen-way cylinder and a sixteen-way electro-pneumatic proportional valve. The sixteen-way cylinder is connected with the sixteen-way electro-pneumatic proportional valve and configured to output the force deforming the mask. The sixteen-way electro-pneumatic proportional valve is connected with the analog output extension module and is configured to control an intensity of an output force of the sixteen-way cylinder according to the first control feedback quantity, thereby achieving a feedback control to the mask deformation.

Additionally, as shown in FIG. 1, the PLC controller subsystem 107 is further configured to compare the air pressure in the connection air pipe acquired by the pressure sensor with a preset air pressure value, and generate a second control feedback quantity. The sixteen-way pneumatic fine-tuning mask deformation control subsystem 400 further includes a commutating solenoid valve configured to control a direction of the output force of the sixteen-way cylinder according to the second control feedback quantity. The PLC controller subsystem 107 is connected with the solenoid valve through an intermediate relay. In this way, the feedback control of the air pressure in the cylinder is achieved, and the precision of the mask deformation control is further improved.

As shown in FIG. 1 and FIG. 2, the PLC controller subsystem 107 is in communication with a host computer over an industrial Ethernet, and the PLC controller subsystem 107 controls a turning-on and off of the solenoid valve through the intermediate relay to achieve a push-out and retraction of the cylinder. The electro-pneumatic proportional valve is controlled through a voltage-type analog output signal to control the output air pressure, thereby controlling a cylinder force output. In this way, the mask force is controlled and the mask deformation is also controlled. A closed-loop effect is achieved through the cylinder output force voltage-type analog signal detected by the force sensor in combination with the PID controller inside the PLC controller subsystem 107.

In the embodiments of the present disclosure, the alignment subsystem 200 includes: an eight-way image acquisition CCD camera, two image acquisition cards 104, an image processor 103, an image acquisition adjustment motor control subsystem 105, and an eight-way illuminating subsystem 300. Each way of the eight-way image acquisition CCD camera is provided with a telecentric lens for acquiring the images. Each of the two image acquisition cards 104 is configured to receive and transmit images acquired by four ways of the CCD camera. The image processor 103 is configured to preprocess the images, transmit the preprocessed images to a central control system, allow the central control system to judge whether the mask is aligned with the substrate according to the images, and generate a regulation instruction for aligning the mask with the substrate. The image acquisition adjustment motor control subsystem 105 is configured to adjust a position of the substrate according to the regulation instruction, so as to align the substrate with the mask. The eight-way illuminating subsystem 300 is configured to provide an illumination for the telecentric lens connected with each of the CCD cameras.

The alignment subsystem 200 further includes: a compact linear displacement stage configured to adjust positions of the CCD cameras; and a multi-channel motion controller configured to move the compact linear displacement stage for a position adjustment according to the regulation instruction issued by the central control system.

According to the embodiments of the present disclosure, the system further includes a host computer 102, and a central control system is built in the host computer. The host computer 102 is configured to issue a program instruction to the PLC controller subsystem 107 according to an actual mask deformation control requirement. The program instruction is configured to generate the first control feedback quantity and regulate the sixteen-way cylinder of the sixteen-way pneumatic fine-tuning mask deformation control subsystem to adjust the deformation quantity of the mask. The host computer 102 is further configured to judge whether the mask is aligned with the substrate according to the images, generate a regulation instruction for aligning the mask with the substrate, and control a mechanical structure for adjusting the position of the substrate to align the substrate with the mask. The host computer 102 is in connection and communication with the sixteen-way pneumatic fine-tuning mask deformation control subsystem 400 through an industrial Ethernet bus, and the host computer 102 is in connection and communication with the alignment subsystem 200 through an industrial Ethernet bus, a PCIe bus or an RS232 serial portion communication bus. The image acquisition card 104 is in connection and communication with the host computer 102 through a PCIe X4 interface. The control by the host computer 102 achieves the feedback control of the mask deformation and the alignment system at the same time with simpler steps, economical costs, and fast reaction speed, thereby improving the alignment efficiency and the deformation control precision.

According to another aspect of the present disclosure, there is provided an intelligent correction device control system for a super-resolution lithography precision mask, including a sixteen-way pneumatic fine-tuning mask deformation control subsystem 400 and an alignment subsystem 200. The sixteen-way pneumatic fine-tuning mask deformation control subsystem 400 includes a mask force detection feedback subsystem, an air pressure output control subsystem, and a PID controller subsystem achieved by a PLC. The alignment subsystem 200 includes an eight-way image acquisition CCD, image acquisition cards 104, an image processor 103 and an eight-way illuminating subsystem 300. Image data acquired by the image acquisition CCD is transmitted to a high-performance host computer 102 through the image acquisition card 104, the host computer 102 preprocesses a related image through the image processor 103, and then makes a feedback to a central control system, so as to provide an image support for an alignment program. The eight-way illuminating subsystem 300 is connected with a phase modulator 106 through a signal generator to generate an excitation signal, so that a light emitted by a helium-neon laser provides an illumination for a telecentric lens connected with the CCD after modulation through a related optical path and an optical fiber transmission channel.

Figure 3:
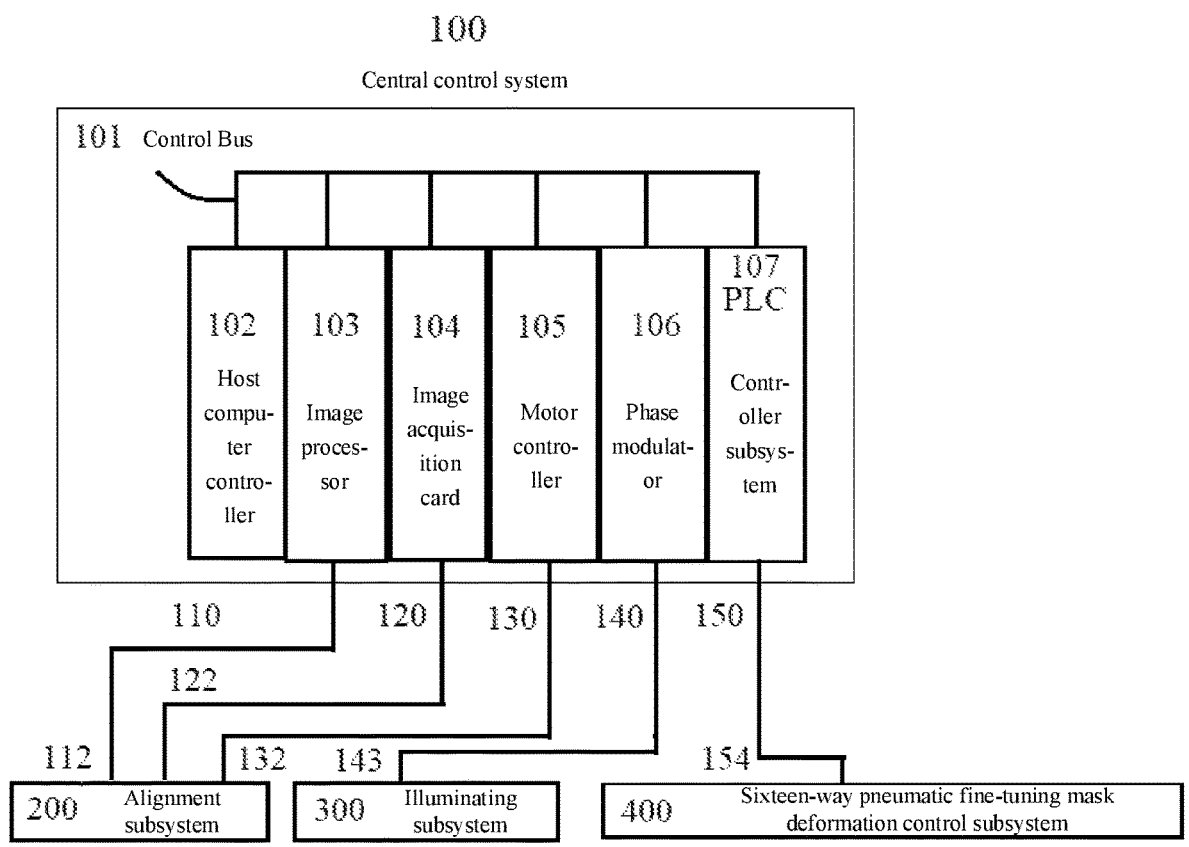
FIG. 3 schematically shows a schematic diagram of an intelligent correction device control system for a super-resolution lithography precision mask according to the embodiments of the present disclosure.

FIG. 3 schematically shows a schematic diagram of an intelligent correction device control system for a super-resolution lithography precision mask according to the embodiments of the present disclosure.

As shown in FIG. 3, the intelligent correction device control system for a super-resolution lithography precision mask according to the embodiments of the present disclosure includes: a central control system 100, a control bus 101, a host computer 102, an image processor 103, an image acquisition card 104, a motor controller 105, a phase modulator 106, and a PLC controller subsystem 107. The image processor 103 is connected to the outside through a PCIe transmission channel 110; the image acquisition card 104 is connected to the outside through an Ethernet transmission channel 120; the motor controller 105 is connected to the outside through a serial port communication bus channel 130; the phase modulator 106 is connected to the outside through an optical fiber transmission channel 140; and the PLC controller subsystem 107 is connected to the outside through a digital and analog control channel 150.

The host computer 120 of the control system is a high-performance industrial computer for an operation of an entire control system and a high-speed image processing calculation. A standard control bus is used as the control bus 101 of the system.

The alignment subsystem 200 includes a multi-channel image acquisition subsystem, an image transmission subsystem, and an image processing subsystem, an image acquisition adjustment motor control subsystem 105 and an eight-way illuminating subsystem 300. The multi-channel image acquisition subsystem includes: an eight-way image acquisition CCD for image acquisition; and a telecentric lens for use in cooperation with the CCD. The image transmission subsystem includes an image acquisition card. 104. A single image acquisition card 104 is configured for a four-channel CCD acquisition data transmission. The image acquisition card 104 includes a trigger for an external triggering condition reception; an acquisition card internal system program for an operation application of the entire image acquisition card 104; a PHY transceiver for transmitting data to a PCIe interface, the data being received from an Ethernet interface and then processed through a system program; and four DDR RAMs for providing an internal storage for an internal program running. The image processing subsystem includes an image processor 103. The image processor uses an RTX 2080 SUPER graphics processing card of the NVIDIA company, and configured to comprehensively process data acquired and simply preprocessed by the image acquisition card 104, and finally transmit processed image data to the central control system. The image acquisition adjustment motor control subsystem 105 includes: a compact linear displacement stage for a CCD position adjustment; and a multi-channel motion controller for a motion control in cooperation with the compact linear displacement stage.

The alignment subsystem 200 may use an industrial Ethernet bus based on a TCP/IP protocol or a customizable industrial Ethernet bus, a PCIe bus based on a PCIe X4 or a customizable PCIe bus, or an RS232 serial port communication bus based on a USRT or a customizable RS232 serial port communication bus. Specifically, the alignment subsystem 200 is connected with the image processor 103 through the PCIe transmission channel 112 of the image processor 103, the alignment subsystem 200 is connected with the image acquisition card 104 through an eight-way CCD Ethernet transmission channel 122, and the alignment subsystem 200 is connected with the motor controller 105 through an eight-way motor controller serial port communication channel 132. The illuminating subsystem 300 is connected with the phase modulator 106 through an optical fiber transmission channel 143 of a helium-neon-laser phase modulation illuminating subsystem 300. The sixteen-way independent fine-tuning control subsystem 400 is connected with the PLC controller subsystem 107 through the force sensor and an analog transmission channel 154 of the electro-pneumatic proportional valve.

In the embodiments of the present disclosure, the central control system 100 acquires a result of images processed by the image processor 103 by a central control program through the PCIe transmission channel 110, processes the images according to the actual requirements, judges an alignment based on the processed images, and performs a corresponding operation. The central control system 100 controls the motor to perform a displacement fine-tuning through the serial port communication bus channel 130 according to the actual requirements, so as to meet the working requirements. The central control system 100 is in communication with the PLC controller subsystem 107 over an industrial Ethernet based on a TCP/IP, and issues a control instruction to the PLC controller subsystem 107 according to an actual mask deformation control requirement, and related subsequent operations such as a slave computer control are performed by the PLC controller subsystem 107.

Figure 4:
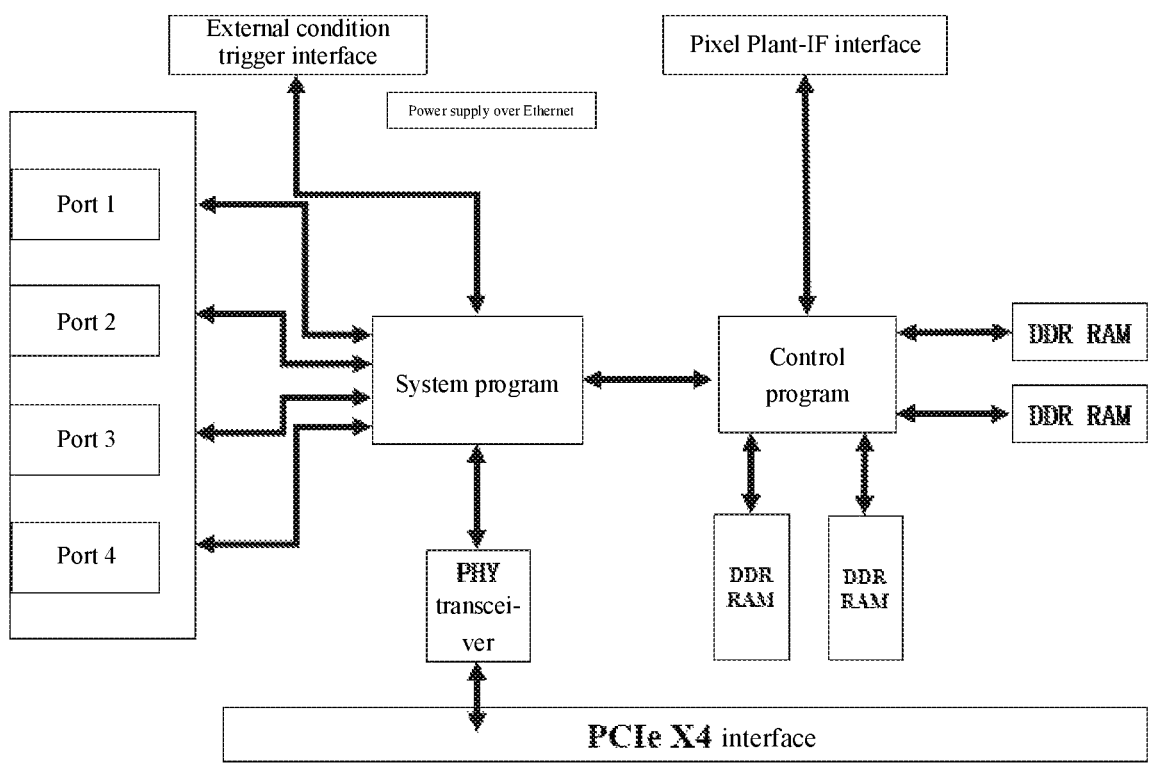
FIG. 4 schematically shows a structural block diagram of an internal structure and channels of image acquisition cards according to the embodiments of the present disclosure.

FIG. 4 schematically shows a structural block diagram of an internal structure and channel of an image acquisition card 104 according to the embodiments of the present disclosure.

As shown in FIG. 4, in the embodiments of the present disclosure, FPGA chip XC3S4000-4FGG900C of XILINX Company is integrated in the image acquisition card 104, and an X4PCI Express® second-generation interface is used to provide a total of 2 GB/s bandwidth to achieve a data transmission between the image acquisition card 104 and the host computer 102. The image acquisition card 104 receives image information transmitted from the CCD Ethernet interface through four Ethernet ports. The control system in this embodiment of the present disclosure uses eight CCDs all together, and therefore two image acquisition cards 104 are used to achieve image transmission. The image acquisition card 104 is connected with the central control system 100 through the PCIe X4 interface, and performs related image processing through the image processor 103. In order to allow a high-speed operation of the system and reduce an instruction sending delay, this host computer 102 uses a dual-way Xeon E5 2620 V3 as a processor, and is configured with a 32 GB RANI and a 256 G SSD to ensure a high-speed operation of the system. System programs and control programs are integrated inside the image acquisition card 104. After image information received by ports 1-4 is preliminarily processed by the system programs, the PHY transceiver transmits the data to the host computer 102 through the PCIe X4 interface. 4 DDR RAMS are also integrated inside the image acquisition card 104 for program operation.

In the embodiments of the present disclosure, the image processor 103 is an RTX 2080 SUPER high-performance graphics card, and data received by the image acquisition card 104 is transmitted to the image processor 103 through the PCIe transmission channel 110, so that the image processor 103 processes the data and transmits the data to the central control system 100. The image acquisition card 104 uses a XILINX XC354000-4FGG900C FPGA chip as a processor, and a single image acquisition card 104 may acquire image data transmitted through four Ethernet transmission channels 122. In this way, a total of two image acquisition cards 104 are used to acquire CCD image data of eight channels.

The motor controller 105 adjusts a position of a CCD image acquisition by controlling motion positions of eight compact linear displacement stages in cooperation with a manual displacement stage.

After a red light having a wavelength of 633 nm generated by the helium-neon laser is collimated and focused, the signal generator generates an excitation signal, the phase modulator 106 modulates the excitation signal, and finally the light is output to the telecentric lens through the optical fiber transmission channel 140. The telecentric lens is connected with the CCD to provide an illumination for the CCD. A total of eight CCDs are used in the present disclosure to observe eight points at four sides of the mask.

More specifically, the sixteen-way pneumatic fine-tuning mask deformation control subsystem 400 further includes a PLC controller subsystem 107 and an analog input and output extension module, a PLC internal PID controller, a mask force detection feedback subsystem, and an air pressure output control subsystem.

The PID controller provided by the PLC controller subsystem 107 is configured to complete a closed-loop control of a cylinder output force. After an actual PID debugging is performed to the apparatus mounted on site, when the cylinder output force, i.e., a force situation of the mask needs to be adjusted subsequently, the force situation detected by the force sensor and the air pressure output situation of the electro-pneumatic proportional valve are regulated through the internal PID controller to achieve the control purpose. A power supply system of the PLC controller subsystem 107 is provided by a DC24 power supply, and at the same time, the DC24 power supply also supplies power for the electro-pneumatic proportional valve, the force sensor, the pressure sensor, the solenoid valve and the like.

The PLC controller subsystem 107 is additionally extended to include an analog output module configured to output a voltage signal controlled by the electro-pneumatic proportional valve, an analog input module configured to achieve a conversion of an analog voltage signal input by the force sensor and the pressure sensor, a digital output module configured to control other buttons, switches and intermediate relays, and a digital input module configured to get access to a digital feedback signal and including a cylinder piston push-out limit switch, etc. The PID controller provided by the PLC controller subsystem 107 is configured to complete a closed-loop control of a cylinder output force. After an actual PID debugging is performed to the apparatus mounted on site, when the cylinder output force, i.e., a force situation of the mask needs to be adjusted subsequently, the force situation detected by the force sensor and the air pressure output situation of the electro-pneumatic proportional valve are regulated through the internal PID controller to achieve the control purpose. A power supply system of the PLC controller subsystem 107 is provided by a DC24 power supply, and at the same time, the DC24 power supply also supplies power for the electro-pneumatic proportional valve, the force sensor, the pressure sensor, the solenoid valve and the like.

The PLC of PLC controller subsystem 107 uses a Siemens S7-1200 CPU 1215C DC/DC/DC as the controller, and the CPU has an operation memory (integrated) of 100 kB, a loading memory (integrated) of 4 MB, a keeping memory (integrated) of 10 kB, an integrated digital I/O of 14 inputs/10 outputs, an integrated analog I/O of 2 inputs/2 outputs, and a process mapping area of 1024 bytes input/1024 bytes output. The basic data type length of the S7-1200 PLC reaches 32 bits. The S7-1200 PLC supports two pointer types: Pointer and Any, so that the S7-1200 has certain flexibility in programming. A Boolean execution speed is 0.08 μs/instruction, a move word variable execution speed is 1.7 μs/instruction, and a floating point calculation execution speed is 2.3 μs/instruction.

The sixteen-way pneumatic fine-tuning mask deformation control subsystem 400 uses an industrial Ethernet bus based on a TCP/IP protocol or a customizable industrial Ethernet bus.

The eight-way illuminating subsystem 300 includes: a helium-neon laser configured to generate a light having a wavelength of 633 nm; a focusing lens configured to focus a collimated light into an optical cable; a collimating lens configured to collimate an output light of the optical cable; an optical cable configured to transmit an optical signal; an adapter configured to connect an optical fiber end with a telecentric objective lens; a phase modulator 106 configured to modulate a related output optical signal; and a signal generator configured to generate an excitation signal of the phase modulator 106.

With the intelligent correction device control system for a super-resolution lithography precision mask provided by the embodiments of the present disclosure, a desired precision mask deformation control may be achieved, the steps are simpler than those in the existing implementation methods, and the control system is also more economically achieved. Moreover, PCIe channels are used in the control system for an image signal transmission, the response speed of the entire control system is also faster, the alignment efficiency is improved, and a mask deformation control and alignment may be achieved faster and more accurately. The sixteen-way pneumatic fine-tuning mask deformation control subsystem of the control system is detected and controlled by a high-precision force sensor and an electro-pneumatic proportional valve, thereby ensuring a precision adjustment of a mask deformation control. A PID control algorithm is used in the sixteen-way pneumatic fine-tuning mask deformation control sub-system to achieve a closed-loop debugging of an output force. In the closed-loop system, a short regulation time, a fast response, a stable system operation and a high control precision with an actual test output force control error being ±0.03 N are achieved. A positioning control of X, Y, and Z axes are achieved in the alignment subsystem of the control system through a high-precision motor, so that an image acquisition and alignment may be completed more efficiently, and an imaging support is provided for a higher overlay accuracy.

Those skilled in the art may understand that various combinations and/or collaborations of the features recited in various embodiments and/or claims of the present disclosure may be performed, even if such combinations or collaborations are not explicitly recited in the present disclosure. In particular, various combinations and/or collaborations of the features recited in various embodiments and/or claims of the present disclosure may be made without departing from the spirit and teaching of the present disclosure. All these combinations and/or collaborations will fall within the scope of the present disclosure.

The present disclosure has been exemplarily represented and described with reference to specific exemplary embodiments of the present disclosure. However, those skilled in the art should understand that, various modifications in form and detail may be made to the present disclosure without departing from the spirit and scope of the present disclosure defined by the appended claims and the equivalents thereof. Therefore, the scope of the present disclosure should not be limited to the above embodiments, but should be determined not only by the appended claims, but also by the equivalents thereof.

What is claimed is:

1. An intelligent correction device control system for a super-resolution lithography precision mask, comprising:
a sixteen-way pneumatic fine-tuning mask deformation control subsystem configured to deform a mask, detect a force value of a mask deformation, compare the force value of the mask deformation with an output force set value, and generate a first control feedback quantity to adjust a force deforming the mask, so as to control a deformation quantity of the mask; and
an alignment subsystem configured to acquire images of the mask and a substrate, and adjust a position between the mask and the substrate according to the images, so as to align the mask with the substrate.

2. The system according to claim 1, wherein the sixteen-way pneumatic fine-tuning mask deformation control subsystem comprises a programmable logic controller (PLC) controller subsystem, the PLC controller subsystem comprising:
a proportional-integral-derivative (PID) controller, an analog input extension module, an analog output extension module, a digital input extension module and a digital output extension module; wherein,
the analog input extension module is configured to perform an analog (A)/ digital (D) conversion to an acquired analog electrical signal of the force value;
the digital input extension module is configured to input a digital signal obtained by the A/D conversion to the PID controller;
the PID controller is configured to compare the digital signal obtained by the A/D conversion with the output force set value, and generate the first control feedback quantity;
the digital output extension module is configured to output a digital signal of the first control feedback quantity to the analog output extension module; and
the analog output extension module is configured to perform a D/A conversion to the digital signal of the first control feedback quantity, and output an analog electrical signal of the first control feedback quantity obtained by the conversion, so as to form a closed-loop feedback to the mask deformation.

3. The system according to claim 2, wherein the sixteen-way pneumatic fine-tuning mask deformation control subsystem further comprises an air pressure output control subsystem, the air pressure output control subsystem comprising:
a sixteen-way cylinder configured to output the force deforming the mask; and
a sixteen-way electro-pneumatic proportional valve configured to control an intensity of an output force of the sixteen-way cylinder according to the first control feedback quantity.

4. The system according to claim 3, wherein the sixteen-way pneumatic fine-tuning mask deformation control subsystem further comprises a mask force detection feedback subsystem, the mask force detection feedback subsystem comprising:
a sixteen-way force sensor configured to acquire the force value of the mask deformation; and
a pressure sensor configured to acquire an air pressure in a connection air pipe of the sixteen-way air cylinder.

5. The system according to claim 4, wherein,
the PLC controller subsystem is further configured to compare the air pressure with a preset air pressure value, and generate a second control feedback quantity;
the sixteen-way pneumatic fine-tuning mask deformation control subsystem further comprises a commutating solenoid valve configured to control a direction of the output force of the sixteen-way cylinder according to the second control feedback quantity; and
the PLC controller subsystem is connected with the commutating solenoid valve through an intermediate relay.

6. The system according to claim 2, wherein the alignment subsystem comprises:
an eight-way image acquisition charge coupled device (CCD) camera, wherein each way of the CCD camera is provided with a telecentric lens for acquiring the images;
two image acquisition cards, wherein each of the image acquisition cards is configured to receive and transmit images acquired by four ways of the CCD camera;
an image processor configured to preprocess the images, transmit the preprocessed images to a central control system, allow the central control system to judge whether the mask is aligned with the substrate according to the images, and generate a regulation instruction for aligning the mask with the substrate;
an image acquisition adjustment motor control subsystem configured to adjust a position of the substrate according to the regulation instruction, so as to align the substrate with the mask; and
an eight-way illuminating subsystem configured to provide an illumination for the telecentric lens connected with each way of the CCD camera.

7. The system according to claim 6, further comprising:
a host computer, wherein a central control system is built in the host computer; wherein,
the host computer is configured to issue a program instruction to the PLC controller subsystem according to an actual mask deformation control requirement, and the program instruction is configured to generate the first control feedback quantity and regulate the sixteen-way pneumatic fine-tuning mask deformation control subsystem to adjust the deformation quantity of the mask; and
the host computer is further configured to judge whether the mask is aligned with the substrate according to the images, and generate a regulation instruction for aligning the mask with the substrate.

8. The system according to claim 7, wherein the host computer is in connection and communication with the sixteen-way pneumatic fine-tuning mask deformation control subsystem through an industrial Ethernet bus, the host computer is in connection and communication with the alignment subsystem through an industrial Ethernet bus, a peripheral component interconnect express (PCIe) bus or an RS232 serial port communication bus, and the image acquisition card is in connection and communication with the host computer through a PCIe X4 interface.

9. The system of claim 7, wherein the alignment subsystem further comprises:
a compact linear displacement stage configured to adjust a position of the CCD camera; and
a multi-channel motion controller configured to move the compact linear displacement stage for a position adjustment according to the regulation instruction issued by the central control system.

10. An intelligent correction device control system for a super-resolution lithography precision mask, comprising a sixteen-way pneumatic fine-tuning mask deformation control subsystem and an alignment subsystem, wherein the sixteen-way pneumatic fine-tuning mask deformation control subsystem comprises a mask force detection feedback subsystem, an air pressure output control subsystem, and a PID controller subsystem achieved by a PLC, wherein the alignment subsystem comprises an eight-way image acquisition CCD, an image acquisition card, an image processor and an eight-way illuminating subsystem, and wherein image data acquired by the image acquisition CCD is transmitted to a high-performance host computer through the image acquisition card, the host computer preprocesses a related image through the image processor and then makes a feedback to a central control system, so as to provide an image support for an alignment program, and the eight-way illuminating subsystem is connected with a phase modulator through a signal generator to generate an excitation signal, so that a light emitted by a helium-neon laser is modulated to provide an illumination for a telecentric lens connected with the CCD through a related optical path and an optical fiber transmission channel.

11. The system according to claim 10, wherein a standard control bus is used as a control bus of the system; and an industrial Ethernet bus based on a transmission control protocol/internet protocol (TCP/IP) protocol or a customizable industrial Ethernet bus is used by the sixteen-way pneumatic fine-tuning mask deformation control subsystem.

12. The system according to claim 10, wherein the sixteen-way pneumatic fine-tuning mask deformation control subsystem further comprises a PLC controller subsystem and analog input and output extension modules, a PID controller inside the PLC, a mask force detection feedback subsystem and an air pressure output control subsystem.

13. The system according to claim 10, wherein an industrial Ethernet bus based on a TCP/IP protocol or a customizable industrial Ethernet bus is used by the alignment subsystem, or a PCIe bus based on a PCIe X4 or a customizable PCIe bus is used by the alignment subsystem, or an RS232 serial port communication bus based on a universal synchronous receiver transmitter (USRT) or a customizable RS232 serial port communication bus is used by the alignment subsystem.

14. The system according to claim 10, wherein the alignment subsystem comprises a multi-channel image acquisition subsystem, an image transmission subsystem, and an image processing subsystem, an image acquisition adjustment motor control subsystem and an eight-way illuminating subsystem.

15. The system according to claim 10, wherein the system comprises: a high-performance industrial computer for an operation of the system and a high-speed image processing calculation.

16. The system according to claim 12, wherein the PLC controller subsystem comprises: a PLC controller for providing a sixteen-way PID controller to complete an output force closed-loop control algorithm; an analog input extension module for a force sensor analog input conversion to complete a feedback force D/A conversion and also for an input air pressure detection to complete a D/A conversion, an analog output extension module for an electro-pneumatic proportional valve control signal output to complete an A/D conversion; a digital output extension module for a cylinder output commutation control to complete a cylinder push-out and retraction control, wherein this process is completed by controlling an intermediate relay to start a corresponding commutating solenoid valve; and a digital input extension module for a sensor signal reception.

17. The system according to claim 14, wherein the multi-channel image acquisition subsystem comprises: an eight-way image acquisition CCD for image acquisition; and a telecentric lens for use in cooperation with the CCD.

18. The system according to claim 14, wherein the image transmission subsystem comprises: an image acquisition card, wherein a single image acquisition card is configured for a four-channel CCD acquisition data transmission, and the image acquisition card comprises a trigger for an external triggering condition reception; an acquisition card internal system program for an operation application of the image acquisition card; a physical layer (PHY) transceiver for transmitting data to a PCIe interface, wherein the data is received from an Ethernet interface and then processed through a system program; and four DDR RAMS for providing an internal program running memory.

19. The system according to claim 14, wherein the image processing subsystem comprises an image processor, wherein an RTX 2080 SUPER graphics processing card of NVIDIA company is used as the image processor, and the image processor is configured to comprehensively process data acquired and simply preprocessed by the image acquisition card, and transmit processed image data to the central control system.

20. The system according to claim 14, wherein the image acquisition adjustment motor control subsystem comprises: a compact linear displacement stage for a CCD position adjustment; and a multi-channel motion controller for a motion control in cooperation with the compact linear displacement stage.

21. The system according to claim 14, wherein the eight-way illuminating subsystem comprises: a helium-neon laser configured to generate a light having a wavelength of 633 nm; a focusing lens configured to focus a collimated light into an optical cable; a collimating lens configured to collimate an output light of the optical cable; an optical cable configured to transmit an optical signal; an adapter configured to connect an optical fiber end with a telecentric objective lens; a phase modulator configured to modulate a related output optical signal; and a signal generator configured to generate an excitation signal of the phase modulator.

* * * * *